United States Patent
Weigell et al.

(10) Patent No.: US 10,802,075 B1
(45) Date of Patent: Oct. 13, 2020

(54) POWER SUPPLY DEVICE AND METHOD FOR PROVIDING AN OUTPUT SIGNAL

(71) Applicant: Rohde & Schwarz GmbH & Co. KG, Munich (DE)

(72) Inventors: Philipp Weigell, Baierbrunn (DE); Sascha Kunisch, Haibach (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/458,518

(22) Filed: Jul. 1, 2019

(51) Int. Cl.
| G01R 31/3187 | (2006.01) |
| G01R 31/317 | (2006.01) |
| G06F 13/16 | (2006.01) |
| G01R 31/28 | (2006.01) |
| G01R 31/50 | (2020.01) |
| G01R 31/3177 | (2006.01) |
| G01R 31/52 | (2020.01) |

(52) U.S. Cl.
CPC ... G01R 31/31721 (2013.01); G01R 31/2856 (2013.01); G01R 31/2884 (2013.01); G01R 31/3177 (2013.01); G01R 31/3187 (2013.01); G01R 31/50 (2020.01); G01R 31/52 (2020.01); G06F 13/1605 (2013.01); *G01R 31/2818* (2013.01); *G01R 31/2829* (2013.01)

(58) Field of Classification Search
CPC ............... G01R 31/2884; G01R 31/50; G01R 31/3187; G01R 31/2856; G01R 31/3177; G01R 31/52; G01R 31/2829; G01R 31/2818

USPC ......... 324/71, 378, 403, 415, 425, 500, 537, 324/750.3
See application file for complete search history.

(56) References Cited

U.S. PATENT DOCUMENTS

| 2017/0185096 A1* | 6/2017 | Rueger | G05F 3/262 |
| 2017/0279359 A1* | 9/2017 | Goncalves | H02J 3/00 |
| 2020/0119648 A1* | 4/2020 | Lee | H02M 1/08 |

* cited by examiner

*Primary Examiner* — Raul J Rios Russo
(74) *Attorney, Agent, or Firm* — Westman, Champlin & Koehler, P.A.

(57) ABSTRACT

The present invention relates to a power supply device, comprising a pre-regulator for generating an auxiliary signal by regulating an input signal; a post-regulator for providing an output signal by regulating the auxiliary signal generated by the pre-regulator; and a processing unit for providing a first arbitration signal to the pre-regulator and for providing a second arbitration signal to the post-regulator. The input signal is regulated based on the first arbitration signal, and the auxiliary signal is regulated based on the second arbitration signal. The second arbitration signal comprises a time delay relative to the first arbitration signal. The first arbitration signal and the second arbitration signal are chosen such that a voltage of the auxiliary signal being generated by the pre-regulator is higher than a voltage of the output signal being provided by the post-regulator.

15 Claims, 3 Drawing Sheets

US 10,802,075 B1

POWER SUPPLY DEVICE AND METHOD FOR PROVIDING AN OUTPUT SIGNAL

TECHNICAL FIELD

The present invention relates to a power supply device, and in particular to an arbitrary waveform generator. Moreover, the invention relates to a method for providing an output signal.

BACKGROUND

Power supply devices may provide electrical output or source signals according to predefined requirements. For instance, arbitrary waveform generators, AWG, provide electrical waveforms that can be applied to devices under test, DUT, to determine properties of the device under test by analyzing the response signal of the device under test. For example, the arbitrary wave generator may repetitively sweep the frequency of the output signal and may evaluate the frequency response of an electronic circuit.

The waveform can be defined by determining waypoints, e.g. specific voltage values, current values or power values for a certain number of time points along the waveform. At each time point, the arbitrary waveform generator may jump to the respective voltage value. In this case, the waveforms can be described by the dwell times, i.e. the lengths of the time intervals during which the voltage remains stable before jumping to the next voltage value.

Small dwell times can lead to relatively high power dissipation. Accordingly, for practical reasons, the dwell times are typically chosen to be in the millisecond domain.

High-precision applications, however, require extremely accurate output signals, following the predetermined waveform as precise as possible. Accordingly, there is a need for providing output signals with improved signal characteristics.

SUMMARY

The present invention solves this problem by the power supply device as recited in claim 1 and a method for providing an output signal as recited in claim 9. Further embodiments are subject matter of the dependent claims.

According to a first aspect, the invention provides a power supply device with a pre-regulator, a post-regulator and a processing unit. The pre-regulator generates an auxiliary signal by regulating an input signal. The post-regulator provides an output signal by regulating the auxiliary signal generated by the pre-regulator. The processing unit provides a first arbitration signal to the pre-regulator and provides a second arbitration signal to the post-regulator. The pre-regulator regulates the input signal based on the first arbitration signal. The post-regulator regulates the auxiliary signal based on the second arbitration signal. The second arbitration signal comprises a time delay relative to the first arbitration signal. The first arbitration signal and the second arbitration signal are chosen such that a voltage of the auxiliary signal being generated by the pre-regulator is higher than a voltage of the output signal being provided by the post-regulator.

According to a second aspect, the invention provides a method for providing an output signal. An input signal is provided, and a pre-regulator generates an auxiliary signal by regulating the input signal based on a first arbitration signal. A post-regulator provides the output signal by regulating the auxiliary signal generated by the pre-regulator based on a second arbitration signal. The second arbitration signal comprises a time delay relative to the first arbitration signal. The first arbitration signal and the second arbitration signal are chosen such that a voltage of the auxiliary signal being generated by the pre-regulator is higher than a voltage of the output signal being provided by the post-regulator.

The invention proposes to provide an output signal generated by the operation of a pre-regulator and the operation of a post-regulator. The pre-regulator and the post-regulator are controlled using respective first and second arbitration signals. There is a time delay between the first arbitration signal and the second arbitration signal, i.e. the first arbitration signal hurries ahead as compared to the second arbitration signal. The time delay translates into respective dwell times. By selecting a suitable time delay between the first arbitration signal and the second arbitration signal, the dwell time can be significantly reduced. At the same time, there is no dramatic increase in power dissipation, thereby making the power supply device very cost-efficient. Further, the power supply device is rendered faster and more efficient. Moreover, the settling time required to reach a desired power, voltage or current can be reduced.

According to a further embodiment of the power supply device, the second arbitration signal comprises a higher resolution than the first arbitration signal. According to an embodiment, the second arbitration signal has a higher resolution than the first arbitration signal if the second arbitration signal is generated based on a large number of waypoints, i.e. the voltage values of the second arbitration signal are fixed for a large number of time points as compared to the voltage values of the first arbitration signal. The higher resolution may correspond to at least one of voltage, current or power values of the first and second arbitration signal, respectively. The pre-regulator is controlled based on the first arbitration signal to bring the voltage close to the desired values. However, fine-tuning is not necessary at this stage. The post-regulator is controlled based on the second arbitration signal to provide an output signal which corresponds as precisely as possible to a predetermined waveform.

To account for the higher precision required at the post-regulator stage, the resolution of the second arbitration signal is higher than the resolution of the first arbitration signal.

According to a further embodiment of the power supply device, the time delay between the first arbitration signal and the second arbitration signal is between 100 microseconds and 500 milliseconds. Preferably, the time delay between the first arbitration signal and the second arbitration signal is between 100 microseconds and 1 millisecond. More preferably, the time delay between the first arbitration signal and the second arbitration signal is between 100 microseconds and 500 microseconds. By choosing a small value for the time delay between the first arbitration second and the second arbitration signal, the dwell time can be reduced to values of preferably less than 1 millisecond.

According to a further embodiment of the power supply device, the post-regulator comprises a linear regulator. By combining pre-regulators and post-regulators, high losses typical of purely linear regulation can be avoided.

According to a further embodiment of the power supply device, the pre-regulator comprises a switching regulator. The switching regulator accepts a wide range of input voltages and the auxiliary signal provided by the pre-regulator may have a voltage slightly above the voltage of the desired output signal. The post-regulator, e.g. a linear regulator, can eliminate the remaining noise generated by the pre-regulator, e.g. the switching regulator. In other words, the post-regulator accounts for precision regulation, allowing the power supply device to achieve a high output power with high efficiency and minimal space requirements.

According to a further embodiment of the power supply device, the pre-regulator may comprise a silicon controlled rectifier regulator (SCR regulator).

According to a preferred embodiment, the power supply device further comprises a user interaction unit adapted to receive control signals from a user. The processing unit is adapted to adjust the time delay between the first arbitration signal and the second arbitration signal based on the control signal. By changing the time delay between the first arbitration signal and the second arbitration signal, the user may fine-tune the dwell time of the output signal, i.e. the resolution of the output signal. A smaller time delay may correspond to a higher resolution, i.e. a more precise output signal.

According to a further embodiment of the power supply device, the processing unit is adapted to vary the time delay between the first arbitration signal and the second arbitration signal. The processing unit is adapted to adjust at least one of the first arbitration signal and the second arbitration signal based on the value of the time delay between the first arbitration signal and the second arbitration signal. The processing unit may adjust the first arbitration signal and/or the second arbitration signal such that the voltage of the auxiliary signal being generated by the pre-regulator remains higher than the voltage of the output signal being provided by the post-regulator.

According to a further embodiment of the power supply device, the output signal is a source signal to be applied to a device under test, wherein the device further comprises a response signal receiving unit adapted to receive a response signal to the source signal from the device under test.

According to a further embodiment of the power supply device, the device is an arbitrary waveform generator.

According to a further embodiment of the power supply device, the input signal may be externally supplied to the power supply device. For instance, the supply device may comprise a power cable for connection with a wall outlet to receive the input signal.

According to a further embodiment of the power supply device, the input signal is provided by the power supply device itself. For instance, the power supply device may comprise batteries or other energy sources for providing the input signal.

According to a further embodiment of the method, a resolution of the second arbitration signal is higher than a resolution of the first arbitration signal.

According to a further embodiment of the method, the time delay between the first arbitration signal and the second arbitration signal is between 100 microseconds and 500 microseconds.

According to a further embodiment of the method, the post-regulator comprises a linear regulator.

According to a further embodiment of the method, the time delay between the first arbitration signal and the second arbitration signal is adjusted based on a control signal received from a user.

According to a further embodiment of the method, the time delay between the first arbitration signal and the second arbitration signal is variable, wherein at least one of the first arbitration signal and the second arbitration signal is adjusted based on the value of the time delay between the first arbitration signal and the second arbitration signal.

According to a further embodiment of the method, the output signal is applied to a device under test as a source signal, wherein a response signal to the source signal from the device under test is received.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
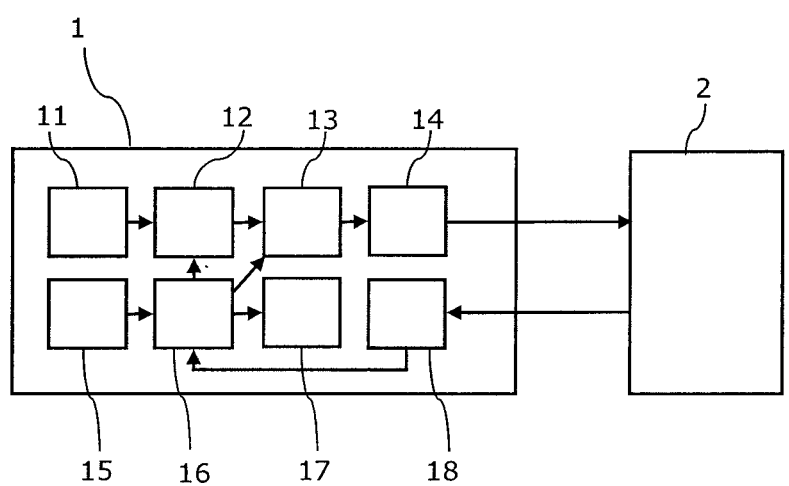
FIG. 1 shows a schematic block diagram of a power supply device according to an embodiment of the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a schematic block diagram of a power supply device 1 according to an embodiment of the invention. The power supply device 1 is adapted to provide a predefined output signal. For example, the power supply device 1 may be an arbitrary waveform generator.

The power supply device 1 comprises a first signal input 11 adapted to receive an input signal. The first signal input 11 may comprise a power cable. The first signal input 11 may further comprise components for modifying or transforming the input signal, e.g. transformers, converters and the like.

The (possibly modified or transformed) input signal is further regulated by a pre-regulator 12 of the power supply device 1, thereby generating an auxiliary signal. The pre-regulator 12 may be a switching regulator. The pre-regulator 12 may also be a silicon controlled rectifier regulator (SCR regulator).

The pre-regulator 12 may be adapted to generate the auxiliary signal such that the voltage values of the auxiliary signal remain slightly above the voltage values of the desired output signal at the respective time points.

The power supply device 1 further comprises a post-regulator 13 which provides an output signal by regulating the auxiliary signal generated by the pre-regulator 12. The post-regulator 13 may be a linear regulator. The post-regulator 13 may be adapted to eliminate the remaining noise, i.e. bring the output signal as close as possible to the desired waveform.

The power supply device 1 further comprises a signal output 14 adapted to provide the output signal generated by the post-regulator 13 to a device under test 2. The device under test 2 may be a printed circuit board comprising a plurality of electronic components, e.g. discrete components such as coils or capacitors as well as integrated components such as microprocessors or ASICs. The device under test 2 may be connected to the supply device 1 using at least one cable.

The power supply device 1 comprises a response signal receiving unit 18 adapted to receive a response signal from the device under test 2 in response to the output signal provided to the device under test 2 via the signal output 14. The device under test 2 may be connected to the response signal receiving unit 18 with an electrical cable. More generally, the signal output 14 and the response signal receiving unit 18 may be any type of port or link or interface capable of communicating information to the device under test 2, e.g. WLAN, Bluetooth, ZigBee, Profibus, ETHERNET etc.

The response signal receiving unit 18 is connected to a processing unit 16 of the power supply device 1 and provides the response signal received from the device under test 2 to the processing unit 16. The processing unit 16 may comprise a plurality of components, like hardware interfaces, communication controllers, processors and the like. The processing unit 16 can comprise at least one of a central processing unit (CPU) or graphics processing unit (GPU) like a microcontroller (µC), an integrated circuit (IC), an application-specific integrated circuit (ASIC), an applications-specific standard product (ASSP), a digital signal processor (DSP), a field programmable gate array (FPGA) and the like. However, the processing unit may also be software implemented at least in part. Instructions may therefore be stored in a memory that is coupled to a general purpose processor, e.g. via a memory bus. The memory may be a volatile or non-volatile data memory, e.g. a solid-state disk, memory card or the like.

The processing unit 16 may be adapted to generate measurement data based on the received response signal and may be adapted to present part of the measurement data in a suitable form on an output device 17 of the power supply device 1. The output device 17 may be a display being integrated in the power supply device 1. For example, the processing unit 16 may be adapted to generate measurement data based on a frequency response of the device under test 2 and to display a Bode plot on the output device 17.

The processing unit 16 is further adapted to control the pre-regulator 12 and the post-regulator 13 of the power supply device 1. A processing unit 16 generates a first arbitration signal and provides the first arbitration signal to the pre-regulator 12. The pre-regulator 12 generates the auxiliary signal, i.e. regulates the input signal, according to the first arbitration signal. Further, the processing unit 16 generates a second arbitration signal and provides the second arbitration signal to the post-regulator 13. The post-regulator 13 generates the output signal, i.e. regulates the auxiliary signal, according to the second arbitration signal.

The power supply device 1 further comprises a user interface 15 adapted to receive control signals from a user of the power supply device 1. The processing unit 16 generates the first arbitration signal and/or the second arbitration signal based on the control signals received from the user. For example, the user may select a desired waveform for the output signal to be generated by the power supply device 1. The waveform may be selected based on a number of predefined options, e.g. waveforms such as sine, square, ramp, triangle, noise, pulse, exponential rise, exponential fall or sin x/x.

The user may also retrieve waveforms from oscilloscopes. A graph of the generated output signal, for instance the voltage of the output signal as a function of time, can be presented to the user on the output device 17.

The processing unit 16 may be adapted to generate the first arbitration signal such that, after the pre-regulator 12 regulates the input signal based on the first arbitration signal, the voltage values of the auxiliary signal are slightly above the voltage values of the desired waveform selected by the user via the user interface 15. The processing unit 16 may further be adapted to generate the second arbitration signal such that, after the post-regulator 13 regulates the auxiliary signal based on the second arbitration signal, the voltage values of the output signal correspond to the voltage values of the desired waveform selected by the user via the user interface 15.

The first arbitration signal and the second arbitration signal may have different resolutions. In particular, the resolution of the second arbitration signal can be higher than the resolution of the first arbitration signal. For example, the processing unit 16 generates the first arbitration signal based on a number of voltage values defined for certain time points which is smaller than a corresponding number of voltage values used for generating the second arbitration signal.

The first arbitration signal and the second arbitration signal are offset relative to each other, i.e. the second arbitration signal comprises a time delay relative to the first arbitration signal. For instance, for the second arbitration signal, the voltage values are selected for time points which are slightly shifted relative to the corresponding time points used for defining the first arbitration signal. Further, the first arbitration signal and the second arbitration signal may have the same or similar overall shape or behavior, e.g. the same number and position of maxima and minima, however shifted by the signal offset or time delay. The time delay between the first arbitration signal and the second arbitration signal can be between 100 microseconds and 500 milliseconds. Preferably, the time delay between the first arbitration signal and the second arbitration signal is between 100 microseconds and 1 millisecond. More preferably, the time delay between the first arbitration signal and the second arbitration signal is between 100 microseconds and 500 microseconds. That is, the time delay can be smaller than 500 milliseconds, preferably smaller than 100 milliseconds, and more preferably smaller than 1 millisecond. The time delay may be several hundred microseconds.

The processing unit 16 may adjust the time delay between the first arbitration signal and the second arbitration signal based on the control signal received from the user via the user interface 15. The user may select one of several predefined values for the time delay. The value of the time delay may also be continuously adjusted, e.g. the user may input a desired value of the time delay. Instead of directly selecting the value of the time delay, the user may also select a parameter corresponding to or affected by the time delay, e.g. a sweep time. The time delay may also be a predetermined value which cannot be directly changed by the user.

The processing unit 16 selects the first arbitration signal and the second arbitration signal such that the voltage of the auxiliary signal generated by the pre-regulator 12 is higher than a voltage of the output signal being provided by the post-regulator 13. For example, the second arbitration signal may be selected to down-regulate the auxiliary signal to the desired voltage values.

If the delay between the first arbitration signal and the second arbitration signal changes, the processing unit 16 may adjust the first arbitration signal and/or the second arbitration signal to ensure that the output signal corresponds to the desired waveform. The first arbitration signal and the second arbitration signal may also be adjusted to ensure that the time-dependent voltage of the auxiliary signal being generated by the pre-regulator 12 is higher than the time-dependent voltage of the output signal being provided by the post-regulator 13.

Figure 2:
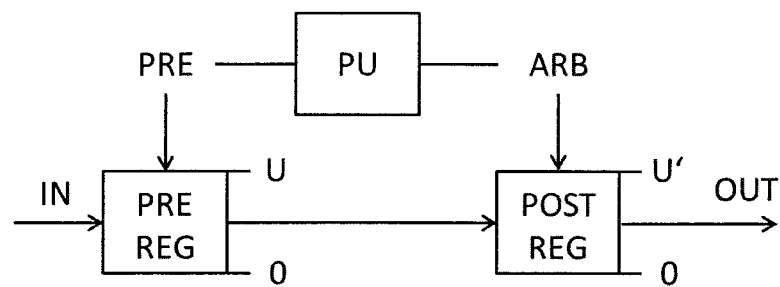
FIG. 2 shows a schematic block diagram of the processing unit, the pre-regulator and the post-regulator of the power supply device.

FIG. 2 shows a schematic block diagram of some of the components of the power supply device 1. The processing unit PU provides the first arbitration signal PRE to the pre-regulator PRE-REG. The pre-regulator PRE-REG regulates the input signal to generate an auxiliary signal having voltage values between 0 and an upper bound U. The voltage values may change according to a predetermined function of time. The processing unit PU further provides a second arbitration signal ARB to the post-regulator POST-REG which generates an output signal OUT having voltage values between 0 and an upper bound U'. The voltage values of the auxiliary signal may preferably be determined such that the voltage values are slightly higher than the desired voltage values of the output signal. Consequently, the upper bound U of the auxiliary signal generated by the pre-regulator PRE-REG is slightly higher than the upper bound U' of the output signal OUT generated by the post-regulator POST-REG.

Figure 3:
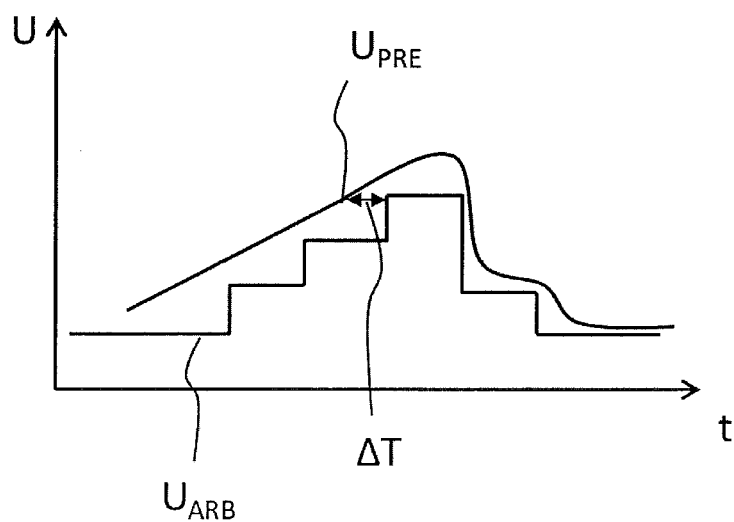
FIG. 3 shows schematically the voltage as a function of time for a first arbitration signal provided to a pre-regulator and for a second arbitration signal provided to a post-regulator.

FIG. 3 schematically shows the voltage as a function of time. A first time-dependent voltage U_PRE corresponds to the first arbitration signal provided to the pre-regulator PRE-REG. The pre-regulator PRE-REG regulates the input signal, e.g. a constant voltage signal, using the first arbitration signal. A second time-dependent voltage U_ARB corresponds to the second arbitration signal provided to the post-regulator POST-REG. As can be seen, for each time point, the voltage U_PRE of the first arbitration signal is slightly larger than the corresponding voltage U_ARB of the second arbitration signal. Moreover, the output second arbitration signal corresponds to a stepwise constant function defined by the user. There is a time delay $\Delta T$ between the first arbitration signal and the second arbitration signal.

Figure 4:
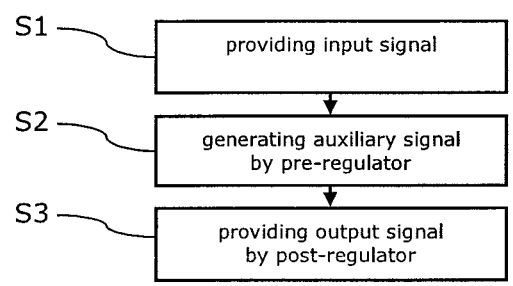
FIG. 4 shows a flow diagram illustrating a method for providing an output signal according to an embodiment of the invention.

FIG. 4 shows a flow diagram illustrating a method for providing an output signal according to an embodiment of the invention.

According to a first method step S1, an input signal is provided to a power supply device 1. The power supply device 1 may also be adapted to provide the input signal by itself. The input signal may comprise a direct current signal having a constant voltage. The input signal may also comprise an alternating current signal. The input signal may further be altered or modified, e.g. using a transformer or converter.

In method step S2, the input signal is provided to a pre-regulator 12 of the power supply device 1. The pre-regulator 12, such as a switching regulator or a silicon controlled rectifier regulator, generates an auxiliary signal by regulating the input signal. The power supply device 1 may be an arbitrary waveform generator. The pre-regulator 12 generates the auxiliary signal using a first arbitration signal provided by a processing unit 16 of the power supply device 1. The first arbitration signal may be generated based on a control signal received by a user. For example, the user may specify a predetermined waveform of the desired output signal.

The input signal may be regulated based on the first arbitration signal to have voltage values close to the voltage values of the desired output signal, e.g. differing from the voltage values of the desired output signal by no more than a predetermined percentage, e.g. by 20 percent, 10 percent, 1 percent or 0.5 percent. Moreover, the voltage values of the auxiliary signal a preferably higher than the voltage values of the desired output signal.

In a further method step S3, an output signal is generated by a post-regulator 13 by regulating the auxiliary signal. The post-regulator 13 may be a linear regulator. Regulating the auxiliary signal is performed based on a second arbitration signal provided by a processing unit 16 of the power supply device 1. The second arbitration signal is determined in such a way, e.g. using control loops, that the output signal resembles as accurate as possible the desired output signal specified by the user.

The second arbitration signal comprises a time delay relative to the first arbitration signal, e.g. a time delay between 100 microseconds and 500 milliseconds. Thus, the first arbitration signal hurries ahead to the second arbitration signal. The time delay may be adapted based on a control signal received from the user. Moreover, the first arbitration signal and the second arbitration signal may be adjusted based on the value of the time delay between the first arbitration signal and the second arbitration signal.

A resolution of the second arbitration signal is preferably higher than a resolution of the first arbitration signal. For example, the second arbitration signal may be generated based on a larger number of waypoints as compared to the first arbitration signal.

The output signal may be applied to a device under test 2 in order to measure the response of the device under test 2. For example, a frequency response of the device under test 2 can be measured. In this case, the output signal has a varying frequency.

Based on the response signal received from the device under test 2, a measurement plot, such as a Bode plot, can be shown to the user, e.g. using an output device 17 such as a display of the power supply device 1.

Moreover, parameters of the power supply device 1 may be adjusted based on control signals of the user. For example, the user may select a parameter which corresponds to the value of the time delay between the first arbitration signal and the second arbitration signal, e.g. a value of the dwell time.

For example, the user may select between several dwell times, e.g. "minimum dwell time", "intermediate dwell time", "maximum dwell time", and the like. The processing unit 16 adapts the time delay between the first arbitration signal and the second arbitration signal to adjust that dwell time selected by the user.

Summarizing, the invention relates to a method and a device for providing an output signal, e.g. using a power supply device such as an arbitrary waveform generator, having low dwell times. Subsequent operation of a pre-regulator and a post-regulator generate the output signal, wherein a first arbitration signal is provided to the pre-regulator for generating an auxiliary signal and a second arbitration signal is provided to the post-generator for generating the output signal, the first and second arbitration signal having a time delay.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A power supply device, comprising:
a pre-regulator adapted to generate an auxiliary signal by regulating an input signal;
a post-regulator adapted to provide an output signal by regulating the auxiliary signal generated by the pre-regulator; and
a processing unit adapted to provide a first arbitration signal to the pre-regulator and to provide a second arbitration signal to the post-regulator, wherein the pre-regulator is adapted to regulate the input signal based on the first arbitration signal, wherein the post-regulator is adapted to regulate the auxiliary signal based on the second arbitration signal, and wherein the second arbitration signal comprises a time delay relative to the first arbitration signal;
wherein the first arbitration signal and the second arbitration signal are chosen such that a voltage of the auxiliary signal being generated by the pre-regulator is higher than a voltage of the output signal being provided by the post-regulator.

2. The power supply device according to claim 1, wherein a resolution of the second arbitration signal is higher than a resolution of the first arbitration signal.

3. The power supply device according to claim 1, wherein the time delay between the first arbitration signal and the second arbitration signal is between 100 microseconds and 500 milliseconds.

4. The power supply device according to claim 1, wherein the post-regulator comprises a linear regulator.

5. The power supply device according to claim 1, further comprising a user interaction unit adapted to receive control signals from a user, wherein the processing unit is adapted to adjust the time delay between the first arbitration signal and the second arbitration signal based on the control signal.

6. The power supply device according to claim 1, wherein the time delay between the first arbitration signal and the second arbitration signal is variable and wherein the processing unit is adapted to adjust at least one of the first arbitration signal and the second arbitration signal based on the value of the time delay between the first arbitration signal and the second arbitration signal.

7. The power supply device according to claim 1, wherein the output signal is a source signal to be applied to a device under test, wherein the power supply device further comprises a response signal receiving unit adapted to receive a response signal to the source signal from the device under test.

8. The power supply device according to claim 1, wherein the device is an arbitrary waveform generator.

9. A method for providing an output signal, comprising the steps:
providing an input signal;
generating, using a pre-regulator, an auxiliary signal by regulating the input signal based on a first arbitration signal; and
providing, by a post-regulator, the output signal by regulating the auxiliary signal generated by the pre-regulator based on a second arbitration signal, wherein the second arbitration signal comprises a time delay relative to the first arbitration signal;
wherein the first arbitration signal and the second arbitration signal are chosen such that a voltage of the auxiliary signal being generated by the pre-regulator is higher than a voltage of the output signal being provided by the post-regulator.

10. The method according to claim 9, wherein a resolution of the second arbitration signal is higher than a resolution of the first arbitration signal.

11. The method according to claim 9, wherein the time delay between the first arbitration signal and the second arbitration signal is between 100 microseconds and 500 milliseconds.

12. The method according to claim 9, wherein the post-regulator comprises a linear regulator.

13. The method according to claim 9, wherein the time delay between the first arbitration signal and the second arbitration signal is adjusted based on a control signal received from a user.

14. The method according to claim 9, wherein the time delay between the first arbitration signal and the second arbitration signal is variable and wherein at least one of the first arbitration signal and the second arbitration signal is adjusted based on the value of the time delay between the first arbitration signal and the second arbitration signal.

15. The method according to claim 9, wherein the output signal is applied to a device under test as a source signal, and wherein a response signal to the source signal from the device under test is received.

* * * * *